United States Patent
Sato (10) Patent No.: US 10,217,599 B2
(45) Date of Patent: Feb. 26, 2019

(54) ELECTRON GUN, CONTROL METHOD AND CONTROL PROGRAM THEREOF, AND THREE-DIMENSIONAL SHAPING APPARATUS

(71) Applicant: TECHNOLOGY RESEARCH ASSOCIATION FOR FUTURE ADDITIVE MANUFACTURING, Tokyo (JP)

(72) Inventor: Takashi Sato, Tokyo (JP)

(73) Assignee: TECHNOLOGY RESEARCH ASSOCIATION FOR FUTURE ADDITIVE MANUFACTURING, Tokyo (JP)

( * ) Notice: Subject to any disclaimer, the term of this patent is extended or adjusted under 35 U.S.C. 154(b) by 0 days.

(21) Appl. No.: 14/785,730

(22) PCT Filed: Jan. 9, 2015

(86) PCT No.: PCT/JP2015/050460
§ 371 (c)(1),
(2) Date: Oct. 20, 2015

(87) PCT Pub. No.: WO2016/110996
PCT Pub. Date: Jul. 14, 2016

(65) Prior Publication Data
US 2017/0154750 A1    Jun. 1, 2017

(51) Int. Cl.
*H01J 37/065* (2006.01)
*H01J 37/06* (2006.01)
(Continued)

(52) U.S. Cl.
CPC .......... *H01J 37/065* (2013.01); *B22F 3/1055* (2013.01); *B33Y 30/00* (2014.12);
(Continued)

(58) Field of Classification Search
CPC ........... H01J 37/24; H01J 37/02; H01J 37/065
See application file for complete search history.

(56) References Cited

U.S. PATENT DOCUMENTS

| 5,834,781 A | 11/1998 | Fukuhara |
| 6,252,344 B1 | 6/2001 | Ooae et al. |

(Continued)

FOREIGN PATENT DOCUMENTS

| EP | 1 339 100 A1 | 8/2003 |
| JP | 56-133824 A | 10/1981 |

(Continued)

OTHER PUBLICATIONS

J-PlatPat English abstract of JP 58-223247 A.
(Continued)

*Primary Examiner* — Nicole M Ippolito
*Assistant Examiner* — Sean M Luck
(74) *Attorney, Agent, or Firm* — Ladas & Parry LLP (57) ABSTRACT

When an emission current is changed, a decrease in brightness of an electron beam is prevented. An electron gun includes a cathode that emits thermoelectrons, a Wehnelt electrode that focuses the thermoelectrons, a control electrode that extracts the thermoelectrons from a distal end of said cathode, an anode that accelerates the thermoelectrons and irradiates a powder with the thermoelectrons as an electron beam, and an optimum condition collection controller that changes at least one of a bias voltage to be applied to the Wehnelt electrode and a control electrode voltage to be applied to the control electrode, and decides a combination of the bias voltage and the control electrode voltage at which the brightness of the electron beam reaches a peak.

10 Claims, 9 Drawing Sheets

(51) Int. Cl.
    *H01J 37/304*     (2006.01)
    *B22F 3/105*      (2006.01)
    *H01J 3/08*       (2006.01)
    *H01J 3/12*       (2006.01)
    *B33Y 30/00*      (2015.01)

(52) U.S. Cl.
    CPC ............ *H01J 3/08* (2013.01); *H01J 3/12* (2013.01); *H01J 37/06* (2013.01); *H01J 37/304* (2013.01); *B22F 2003/1056* (2013.01); *B22F 2003/1057* (2013.01); *B22F 2999/00* (2013.01); *H01J 2237/0653* (2013.01); *H01J 2237/06308* (2013.01); *Y02P 10/295* (2015.11)

(56)           References Cited

U.S. PATENT DOCUMENTS

| | | | |
|---|---|---|---|
| 6,590,216 | B1 * | 7/2003 | Doran .................. H01J 1/135 |
| | | | 250/423 F |
| 8,487,534 | B2 * | 7/2013 | Caiafa .................. H01J 35/06 |
| | | | 315/111.31 |
| 2002/0148975 | A1 | 10/2002 | Kimba et al. |
| 2005/0121611 | A1 | 6/2005 | Kimba et al. |
| 2007/0194235 | A1 | 8/2007 | Kimba et al. |
| 2008/0308729 | A1 | 12/2008 | Kimba et al. |
| 2011/0104830 | A1 | 5/2011 | Kimba et al. |
| 2013/0187058 | A1 * | 7/2013 | Swanson ................ G01T 1/29 |
| | | | 250/393 |
| 2014/0367570 | A1 | 12/2014 | Kimba et al. |
| 2014/0370323 | A1 | 12/2014 | Ackelid |

FOREIGN PATENT DOCUMENTS

| | | | |
|---|---|---|---|
| JP | 57-165943 | A | 10/1982 |
| JP | 58-18833 | A | 2/1983 |
| JP | 58-223247 | A | 12/1983 |
| JP | 58-233247 | A | 12/1983 |
| JP | 63-216261 | A | 9/1988 |
| JP | 1-274349 | A | 11/1989 |
| JP | 5-283032 | A | 10/1993 |
| JP | 2000-11932 | A | 1/2000 |
| JP | 2010-261072 | A | 11/2010 |

OTHER PUBLICATIONS

International Search Report dated Jan. 9, 2015 for Application No. PCT/JP2015/050460.
J-PlatPat English abstract of JP 1-274349 A.
J-PlatPat English abstract of JP 2000-11932 A.
J-PlatPat English abstract of JP 2010-261072 A.
Japanese Office Action dated Dec. 15, 2016 for Japanese Application No. 2016510533 with English translation.
J-PlatPat English abstract of JP 56-133824 A.
J-PlatPat English abstract of JP 63-216261 A.
J-PlatPat English abstract of JP 5-283032 A.
J-PlatPat English abstract of JP 58-233247 A.
J-PlatPat English abstract of JP 57-165943 A.
Extended European Search Report (SESR) dated Jun. 29, 2017 for corresponding Application No. EP 15 778 595.7.
Patent Abstracts of Japan English abstract of JP 58-18833 A.

* cited by examiner

ELECTRON GUN, CONTROL METHOD AND CONTROL PROGRAM THEREOF, AND THREE-DIMENSIONAL SHAPING APPARATUS

RELATED APPLICATION

This application is an application under 35 U.S.C. 371 of International Application No. PCT/JP2015/050460 filed on Jan. 9, 2015, the entire contents of which are incorporated herein by reference.

TECHNICAL FIELD

The present invention relates to an electron gun, a control method and control program thereof, and a three-dimensional shaping apparatus.

BACKGROUND ART

In the above technical field, patent literature 1 discloses an electron gun having a three-electrode arrangement which includes a cathode, Wehnelt electrode, and anode.

CITATION LIST

Patent Literature

Patent literature 1: Japanese Patent Laid-Open No. 1-274349

SUMMARY OF THE INVENTION

Technical Problem

The electron gun described in the above literature cannot prevent a decrease in brightness of an electron beam when an emission current is changed.

The present invention enables to provide a technique of solving the above-described problem.

Solution to Problem

One aspect of the present invention provides an electron gun comprising:
a cathode that emits thermoelectrons;
a Wehnelt electrode that focuses the thermoelectrons;
a control electrode that extracts the thermoelectrons from a distal end of the cathode;
an anode that accelerates the thermoelectrons, and irradiates a powder with the thermoelectrons as an electron beam; and
an optimum condition collection controller that changes at least one of a bias voltage to be applied to the Wehnelt electrode and a control electrode voltage to be applied to the control electrode, and decides a combination of the bias voltage and the control electrode voltage at which a brightness of the electron beam reaches a peak.

Another aspect of the present invention provides a control method of an electron gun, comprising:
determining a degree of wear of a cathode based on an emission current of the electron gun;
executing, when a decrease in the emission current is not smaller than a predetermined threshold, readjustment of a bias voltage and a control electrode voltage of the electron gun; and
executing, when the decrease in the emission current is smaller than the predetermined threshold, fine adjustment of the bias voltage and the control electrode voltage of the electron gun.

Still other aspect of the present invention provides a control program of an electron gun for causing a computer to execute a method, comprising:
determining a degree of wear of a cathode based on an emission current of the electron gun;
executing, when a decrease in the emission current is not smaller than a predetermined threshold, readjustment of a bias voltage and a control electrode voltage of the electron gun; and
executing, when the decrease in the emission current is smaller than the predetermined threshold, fine adjustment of the bias voltage and the control electrode voltage of the electron gun.

Still other aspect of the present invention provides a three-dimensional shaping apparatus using an electron gun stated in claim 1.

Advantageous Effects of Invention

According to the present invention, when an emission current is changed, it is possible to prevent a decrease in brightness of an electron beam.

DESCRIPTION OF THE EMBODIMENTS

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

First Embodiment

An electron gun 100 according to the first embodiment of the present invention will be described with reference to FIG. 1. The electron gun 100 is an apparatus that supplies an electron beam.

Figure 1:
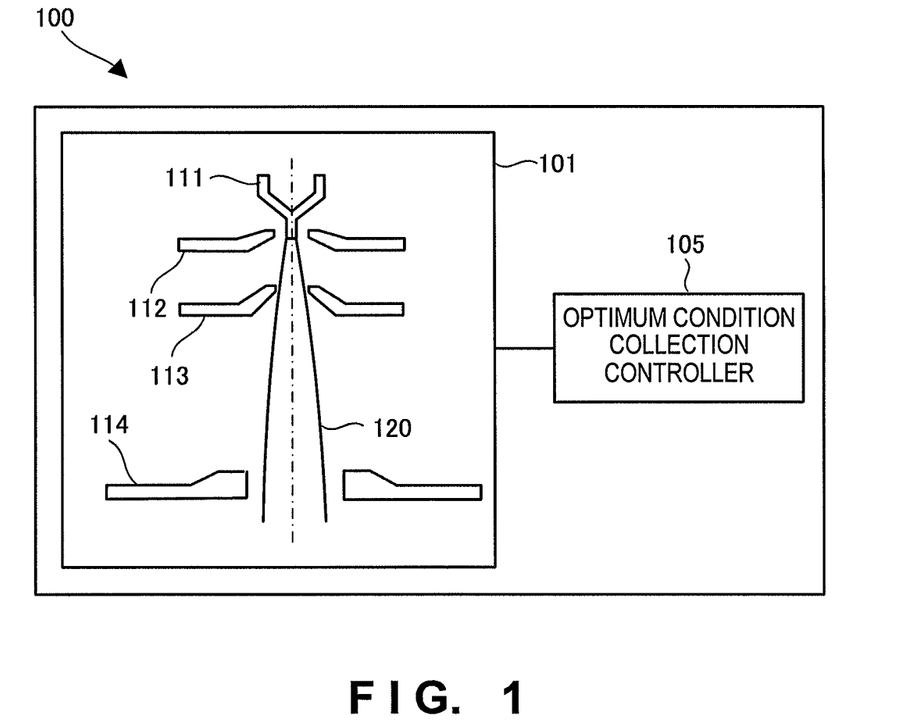
FIG. 1 is a view showing the arrangement of an electron gun according to the first embodiment of the present invention.

As shown in FIG. 1, the electron gun 100 includes an electron beam supply unit 101 and an optimum condition collection controller 105. The electron beam supply unit 101 includes a cathode 111, a Wehnelt electrode 112, a control electrode 113, and an anode 114. The cathode 111 emits thermoelectrons. The Wehnelt electrode 112 focuses the thermoelectrons.

The control electrode 113 controls the electric field strength of the distal end of the cathode 111 to extract the thermoelectrons from the distal end of the cathode. The anode 114 accelerates the thermoelectrons, and irradiates a powder with the thermoelectrons as an electron beam 120.

The optimum condition collection controller 105 changes at least one of a bias voltage to be applied to the Wehnelt electrode 112 and a control electrode voltage to be applied to the control electrode 113, and decides a combination of the bias voltage and control electrode voltage at which the brightness of the electron beam 120 reaches its peak.

According to this embodiment, when an emission current is changed, it is possible to prevent a decrease in brightness of an electron beam. To prevent a decrease in luminance of an electron beam, it is possible to decide a combination of a bias voltage and control voltage at which the brightness of the electron beam reaches its peak.

Second Embodiment

A three-dimensional shaping apparatus according to the second embodiment of the present invention will be described with reference to FIGS. 2 to 9.

Background Art

Figure 2:
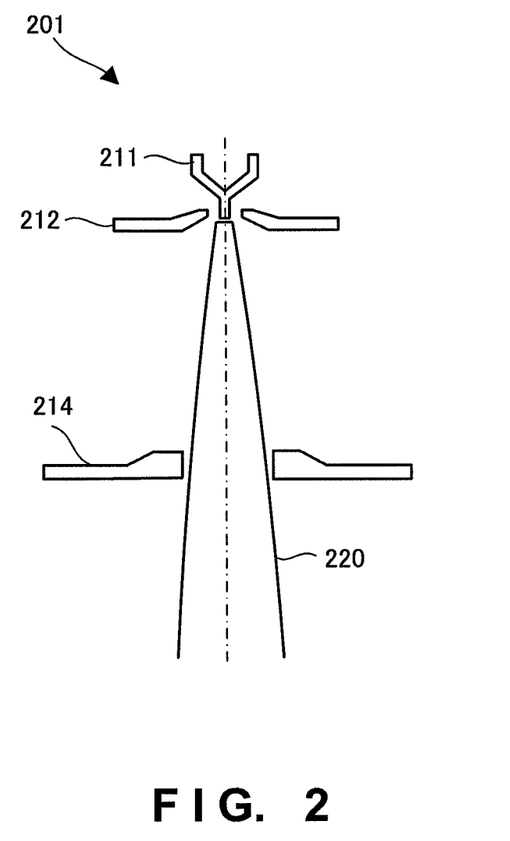
FIG. 2 is a view showing the arrangement of an electron gun used for a three-dimensional shaping apparatus according to the background art of the second embodiment of the present invention.

FIG. 2 is a view for explaining the arrangement of an electron gun 201 used for a three-dimensional shaping apparatus according to the background art of this embodiment. The electron gun 201 includes a cathode 211, a Wehnelt electrode 212, and an anode 214. The electron gun 201 is a three-electrode electron gun. The electron gun 201 can readily obtain a large current, and is thus used for a wide variety of apparatuses such as an electron microscope, electron beam lithography apparatus, electron beam analysis apparatus, and electron beam processing apparatus (welding, surface modification, additive manufacturing, and the like).

For example, the electron beam processing apparatus is generally provided with various processing modes, and needs to quickly change the diameter and beam current of an electron beam 220 according to the processing mode currently used, the use status, and the like. Furthermore, the electron beam of such electron beam processing apparatus has a high acceleration voltage (several ten kV or more) and a large current (10 mA or more). Therefore, if a structure within the apparatus is irradiated with the electron beam 220, it may be damaged.

In these apparatuses, it is impossible to arrange a current control aperture for controlling a beam current on a sample (powder) in an electron optical column. Thus, the whole electron beam 220 emitted by the cathode 211 (electron gun 201) reaches the sample. That is, the beam current on the sample and the emission current are equal to each other. In this case, to change the beam current, it is necessary to change the emission current itself of the electron gun 201.

To quickly change the emission current in the electron gun 201, a method of changing the bias voltage (the voltage applied to the Wehnelt electrode 212) is plausible. In this method, along with a change in bias voltage, the brightness of the electron beam 220 changes.

The brightness is associated with the beam diameter of the electron beam 220 formed on the sample. That is, along with a decrease in brightness of the electron beam 220, the beam diameter of the electron beam 220 becomes larger. If the brightness of the electron beam 220 changes simultaneously with a change in emission current like the electron gun 201, the brightness becomes low for a given emission current, and thus a desired beam diameter cannot be obtained.

Three-Dimensional Shaping Apparatus of Embodiment

Figure 3:
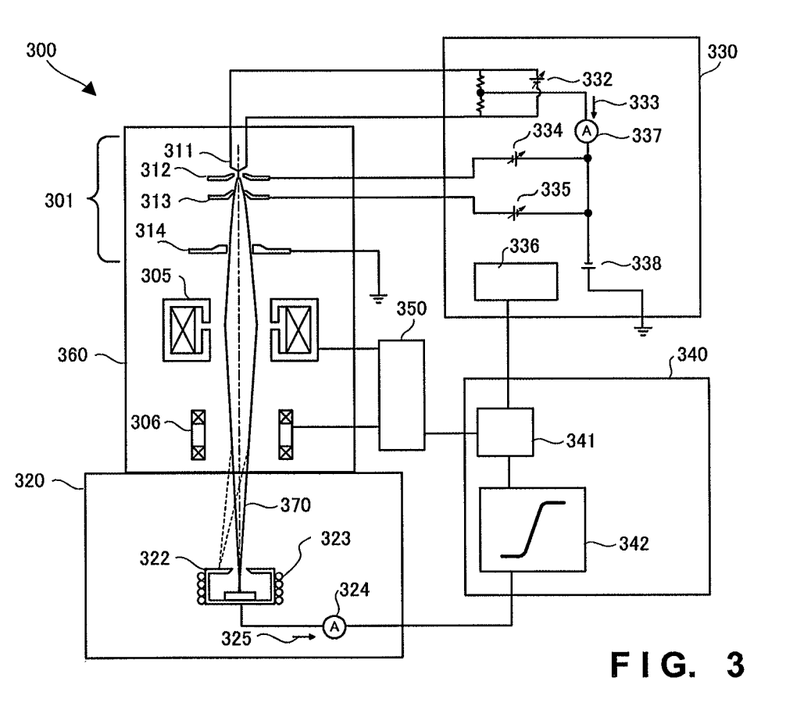
FIG. 3 is a view showing the arrangement of a three-dimensional shaping apparatus according to the second embodiment of the present invention.
Figure 4:
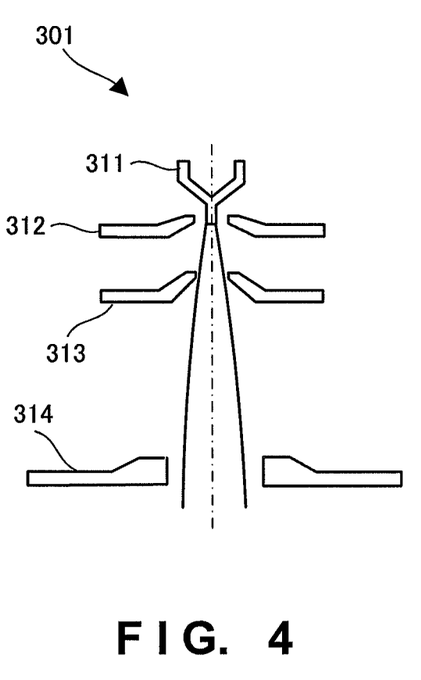
FIG. 4 is a view showing the arrangement of the electron gun of the three-dimensional shaping apparatus according to the second embodiment of the present invention.
Figure 5:
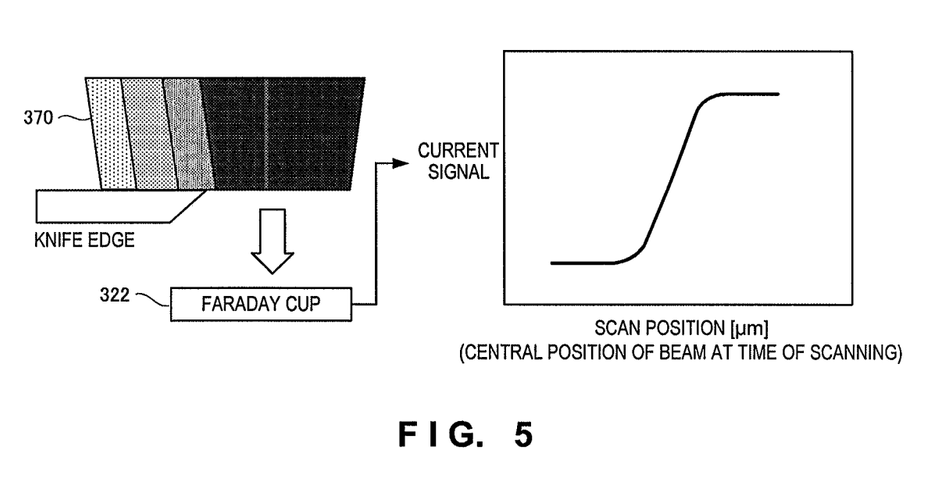
FIG. 5 is a view for explaining processing of acquiring a current signal curve by beam scanning performed by the three-dimensional shaping apparatus according to the second embodiment of the present invention.

FIG. 3 is a view for explaining the arrangement of a three-dimensional shaping apparatus 300 according to this embodiment. FIG. 4 is a view for explaining the arrangement of an electron gun 301 according to this embodiment. FIG. 5 is a view for explaining a current signal curve acquired by beam scanning performed by the three-dimensional shaping apparatus 300 according to this embodiment. The three-dimensional shaping apparatus 300 includes an optical column 360, a vacuum chamber 320, a high voltage power supply 330, a computer 340, and an electron optical system controller 350.

The optical column 360 includes the electron gun 301, a lens 305, and a deflector 306. The electron gun 301 includes a cathode 311, a Wehnelt electrode 312, a control electrode 313, and an anode 314. That is, the electron gun 301 is a four-electrode electron gun formed from four electrodes. The vacuum chamber 320 includes a Faraday cup 322, cooling pipes 323, and an ammeter 324. The beam current and beam diameter of an electron beam 370 are measured using the Faraday cup 322. The Faraday cup 322 is provided with cooling pipes 323 to suppress an increase in temperature caused by irradiation with the electron beam 370.

The ammeter 324 measures a beam current 325 of the electron beam 370. The high voltage power supply 330 includes a cathode heating power supply 332, a bias supply 334, a control electrode power supply 335, a power supply controller 336, an ammeter 337, and an acceleration power supply 338. The ammeter 337 measures a load current 333. The computer 340 includes an optimum condition collection controller 341 and an approximation calculator 342. The electron optical system controller 350 controls an electron optical system including the lens 305 and the deflector 306.

The electron gun 301 is a thermionic-emission electron gun formed from four electrodes, that is, the cathode 311, Wehnelt electrode 312, control electrode 313, and anode 314. The electron gun 301 is operated by the cathode heating power supply 332, bias supply 334, control electrode power supply 335, and acceleration power supply 338 provided in the high voltage power supply 330. The electron beam 370 emitted by the electron gun 301 is controlled by the lens 305 and deflector 306, and focuses on the powder at a predetermined position.

The three-dimensional shaping apparatus 300 decides an optimum combination condition of the bias voltage and control electrode voltage at which the brightness of the electron beam 370 reaches its peak, and adjusts the electron gun 301. To decide an optimum combination condition of the bias voltage and control electrode voltage, it is necessary to measure the beam current and beam diameter. To do this, as shown in FIG. 3, the Faraday cup 322 with a knife edge provided in the vacuum chamber 320 is used. The Faraday cup 322 is provided with the cooling pipes 323 to suppress an increase in temperature caused by beam irradiation. The current signal curve shown in FIG. 5 is measured by performing beam scanning on the boundary of the knife edge using the electron beam 370 emitted by the electron gun 301. Note that the beam current is measured using the Faraday cup in this example. However, the device used to measure the beam current is not limited to this.

Furthermore, the approximation calculator 342 performs curve fitting and differential calculation processing for the acquired current signal curve, thereby calculating the beam diameter of the electron beam 370. The beam current of the electron beam 370 which reaches the sample surface (powder) may be obtained based on the measurement value of the Faraday cup 322. The present invention, however, is not limited to this. Since the value of the beam current of the electron beam 370 is equal to that of the emission current emitted by the cathode 311 (electron gun 301), it is also possible to obtain the beam current by measuring the load current 333 flowing through the high voltage power supply 330 using the ammeter 337.

The above-described series of operations are automatically executed by the optimum condition collection controller 341 included in the computer 340. The optimum condition collection controller 341 sends a command to the power supply controller 336 to change the bias voltage and control electrode voltage in a matrix. At this time, the optimum condition collection controller 341 measures the beam diameter and beam current of the electron beam 370 by the above-described method, calculates a current density under each condition, and records an optimum combination condition of the bias voltage and control electrode voltage for obtaining a specific emission current. The optimum condition collection controller 341 also sends a command to the electron optical system controller 350 to perform beam scanning of the electron beam 370 on the knife edge, focusing or defocusing of the electron beam 370, and the like, as needed.

Figure 6:
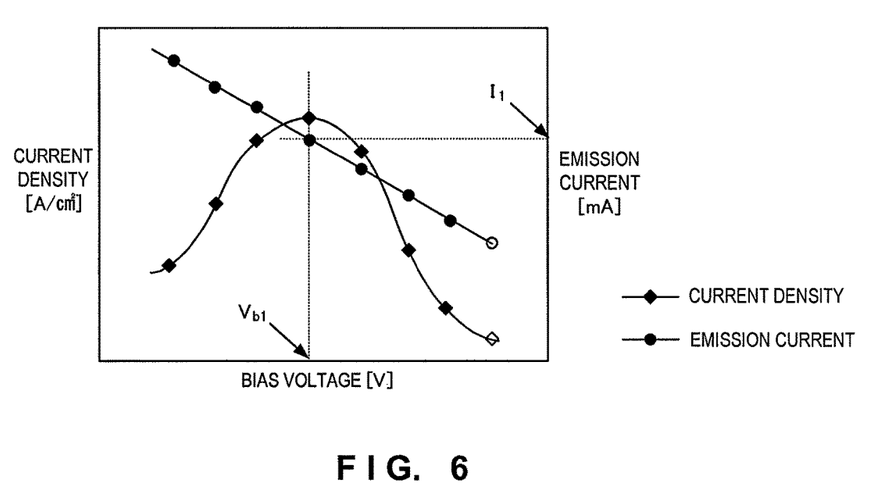
FIG. 6 is a graph showing the current density-bias voltage characteristic and emission current-bias voltage characteristic of the electron gun of the three-dimensional shaping apparatus according to the second embodiment of the present invention.
Figure 7:
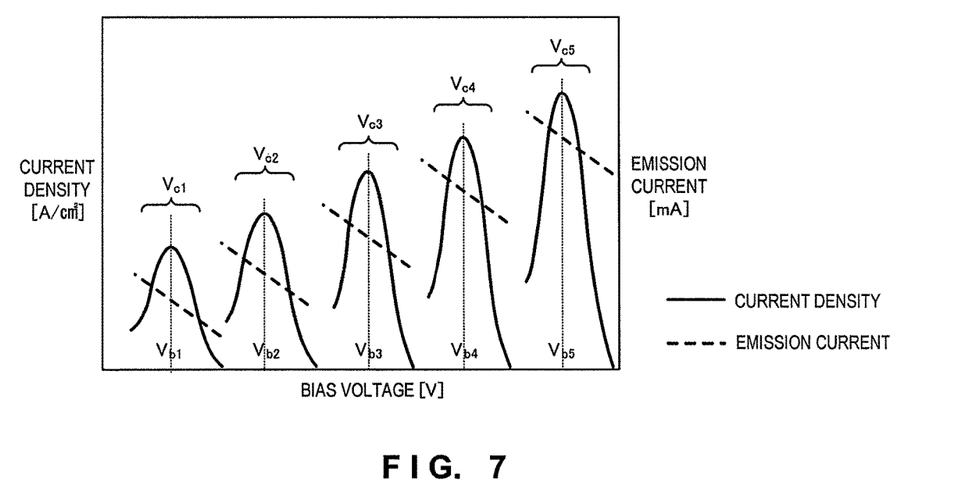
FIG. 7 is another graph showing the current density-bias voltage characteristic and emission current-bias voltage characteristic of the electron gun of the three-dimensional shaping apparatus according to the second embodiment of the present invention.

A method of deciding an optimum combination condition of the bias voltage and voltage electrode voltage will be described by exemplifying the electron gun 301 having a four-electrode arrangement used for the three-dimensional shaping apparatus 300. FIG. 6 is a graph showing the current density-bias voltage characteristic and emission current-bias voltage characteristic of the electron gun 301 according to this embodiment. FIG. 7 is another graph showing the current density-bias voltage characteristic and emission current-bias voltage characteristic of the electron gun 301 according to this embodiment.

The current density of the electron beam 370 is calculated by measuring the beam diameter and beam current of the electron beam 370 while fixing the control electrode voltage to $V_{c1}$ and changing the bias voltage. With this processing, the current density-bias voltage characteristic and emission current-bias voltage characteristic shown in FIG. 6 are obtained. As shown in FIG. 6, there exists a bias voltage $V_{b1}$ at which the current density is highest and the emission current at this time is $I_1$.

A condition under which the current density becomes highest is almost the same as that under which the brightness becomes highest (the brightness reaches its peak). In this case, therefore, a combination ($V_{b1}$, $V_{c1}$) of the bias voltage and control electrode voltage indicates an optimum combination condition for obtaining the emission current $I_1$.

The series of operations are performed while gradually increasing the control electrode voltage like $V_{c2}$, $V_{c3}$, $V_{c4}$, . . . . This makes it possible to obtain a number of combinations of the current density-bias voltage characteristic and emission current-bias voltage characteristic, as shown in FIG. 7, and obtain an optimum combination candidate of the bias voltage and control electrode voltage for a specific emission current. To the contrary, the acceleration voltage is constant in the electron gun having a three-electrode arrangement, and it is possible to obtain only one combination of the current density-bias voltage characteristic and emission current-bias voltage characteristic. That is, in the electron gun having a three-electrode arrangement, when a large emission current is required, it is necessary to decrease the brightness of the electron beam (because the brightness is sacrificed) to increase the beam diameter, thereby disabling high accuracy shaping.

The electron gun having a four-electrode arrangement has the characteristic in which the brightness hardly deteriorates (decreases) even if the emission current is changed. Therefore, such electron gun is appropriate for an electron beam processing apparatus such as a three-dimensional shaping apparatus which is assumed to be used while changing the emission current. That is, even if the emission current is changed, a high-brightness electron beam can be accordingly used, and the beam diameter can be made smaller by focusing the electron beam, thereby allowing high accuracy shaping (processing).

Note that it is necessary to acquire the current density and emission current while the two parameters of the bias voltage and control electrode voltage in a matrix in order to obtain an optimum combination condition. Consequently, it takes an enormous time to manually collect data. In addition, since an optimum combination condition changes as the cathode wears, it is necessary to re-record an optimum combination condition every time the cathode wears to some extent.

Figure 8:
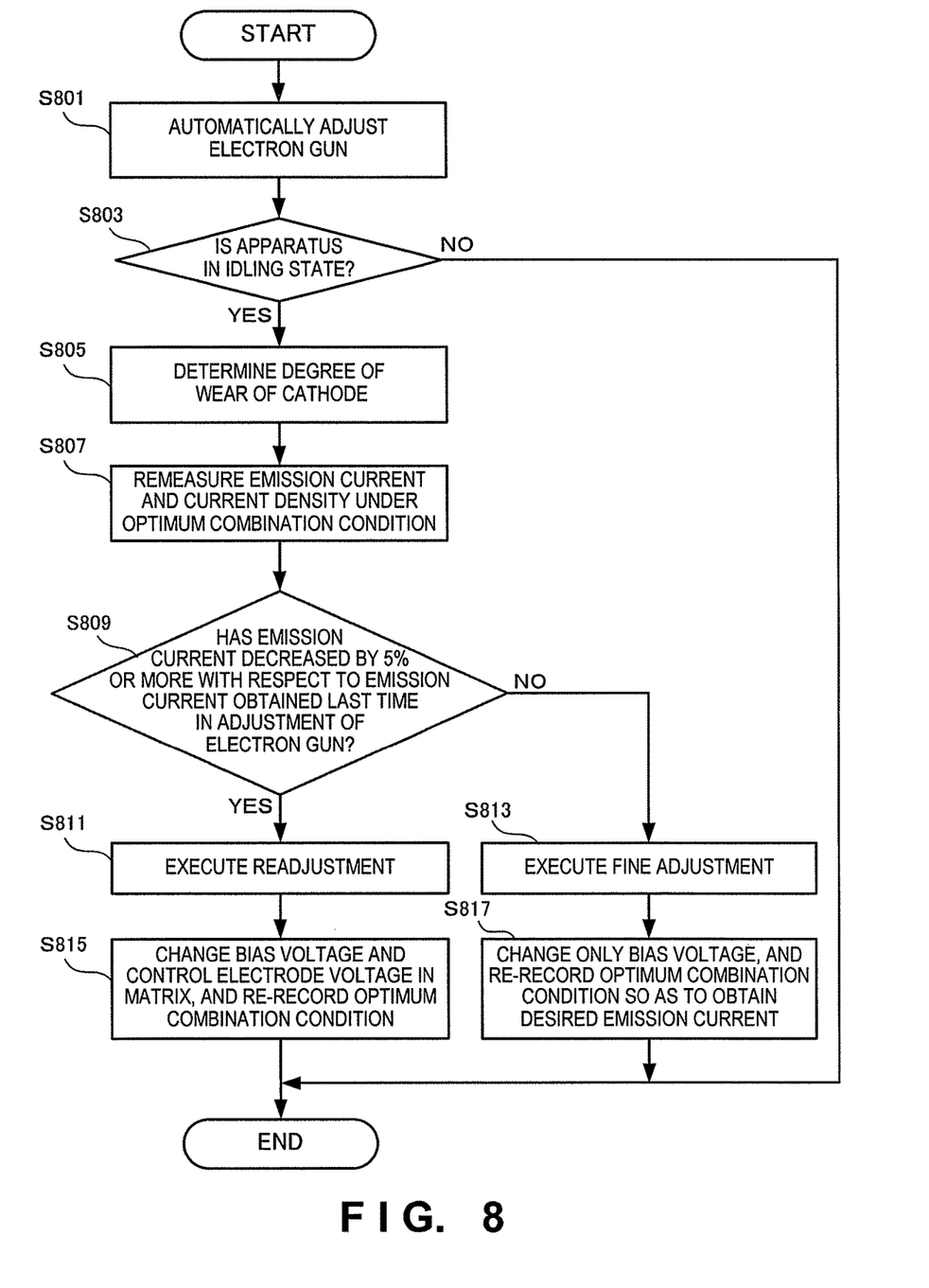
FIG. 8 is a flowchart for explaining the operation of the three-dimensional shaping apparatus according to the second embodiment of the present invention.
Figure 9:
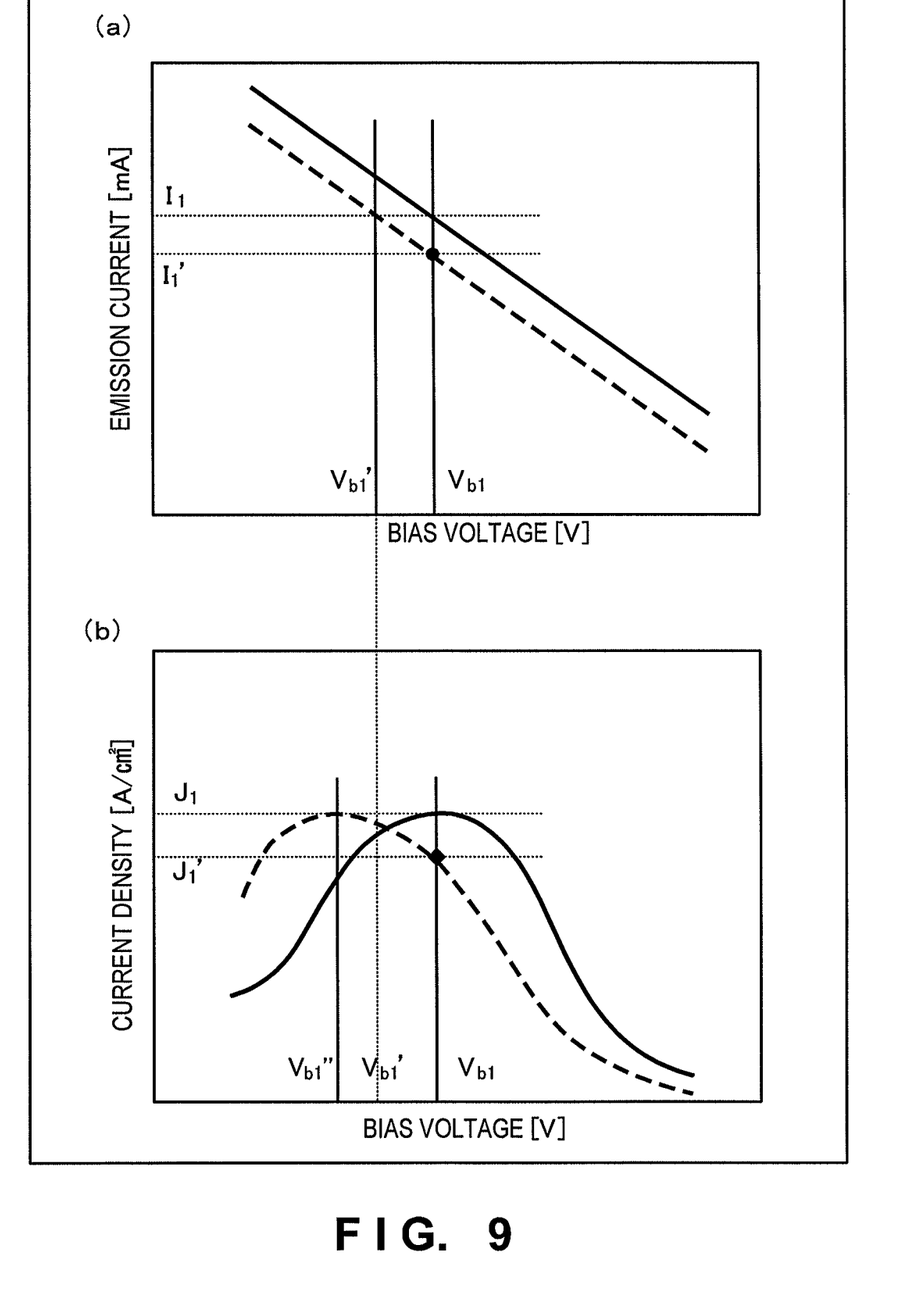
FIG. 9 is a view for explaining an overview of determination of the degree of wear of a cathode by the three-dimensional shaping apparatus according to the second embodiment of the present invention.

FIG. 8 is a flowchart for explaining the operation of the three-dimensional shaping apparatus 300 according to this embodiment. FIG. 9 is a view for explaining an overview of determination of the degree of wear of the cathode by the three-dimensional shaping apparatus 300 according to this embodiment.

The three-dimensional shaping apparatus 300 automatically performs determination of the degree of wear of the cathode 311, and readjustment or fine adjustment of the bias voltage and control electrode voltage according to this flowchart.

In step S801, the three-dimensional shaping apparatus 300 automatically adjusts the electron gun 301 to obtain the electron beam 370 appropriate for manufacturing a shaped object by laminating the powder. That is, the three-dimensional shaping apparatus 300 measures the emission current and current density, and decides a number of combination conditions (optimum combination conditions) of the bias voltage and control electrode voltage at which the brightness becomes highest (the brightness reaches its peak). The electron gun 301 applies a combination optimum for a shaped object shaping condition among the decided optimum combination conditions, and manufactures a shaped object. This makes it possible to always use the electron beam 370 of a highest brightness or peak brightness.

In step S803, the three-dimensional shaping apparatus 300 determines whether it is in an idling state. That is, if the three-dimensional shaping apparatus 300 currently manufactures a shaped object, it ends the operation. If the three-dimensional shaping apparatus 300 is in the idling state, that is, in a standby state (waiting state) without manufacturing a shaped object, it transits, in step S805, to a determination mode in which the degree of wear of the cathode 311 is determined.

If the three-dimensional shaping apparatus 300 transits to the mode of determining the degree of wear of the cathode 311, it remeasures the emission current and current density using the optimum combination condition derived in the automatic adjustment mode of the electron gun 301 in step S807.

In step S809, the three-dimensional shaping apparatus 300 determines whether the emission current remeasured in step S807 has decreased by 5% or more with respect to the emission current obtained last time in adjustment of the electron gun 301. In this example, the remeasured emission current is compared with the emission current obtained last time (immediately before remeasurement). However, the comparison target is not limited to this. For example, the remeasured emission current may be compared with an emission current when the three-dimensional shaping apparatus 300 is activated first. Alternatively, for example, the remeasured emission current may be compared with an emission current immediately after the cathode 311 is replaced due to wear of the cathode 311.

If the remeasured emission current has decreased by 5% or more with respect to the emission current as a comparison target, the three-dimensional shaping apparatus 300 executes readjustment of the electron gun 301 in step S811; otherwise, the three-dimensional shaping apparatus 300 executes fine adjustment of the electron gun 301 in step S813.

If the three-dimensional shaping apparatus 300 executes readjustment of the electron gun 301, it changes the bias voltage and control electrode voltage in a matrix, and re-records an optimum combination condition in step S815. If the three-dimensional shaping apparatus 300 executes fine adjustment of the electron gun 301, it changes only the bias voltage, and re-records an optimum combination condition so as to obtain a desired emission current in step S817.

The degree of wear of the cathode 311 is determined when the apparatus is in the idling state (waiting state). The bias voltage and control electrode voltage are sequentially changed in the order of the optimum combination conditions $(V_{b1}, V_{c1})$, $(V_{b2}, V_{c2})$, $(V_{b3}, V_{c3})$, . . . recorded in the optimum condition collection control circuit 341, thereby acquiring the emission current and current density again.

Since the distal end of the cathode 311 wears with use, the emission current becomes smaller than that when adjusting the cathode 311. Since the distal end of the cathode 311 becomes farther from the Wehnelt electrode 312 as the cathode 311 wears, an optimum bias voltage condition for each control electrode voltage becomes lower than an original condition.

For example, the optimum combination condition $(V_{b1}, V_{c1})$ of the bias voltage and control electrode voltage changes, as shown in FIG. 9, along with wear of the cathode 311. A solid line shown in FIG. 9 indicates a measurement result obtained by changing the bias voltage and control electrode voltage in a matrix at the time of adjustment of the electron gun 301. In FIG. 9, a dot indicates a measurement result in determination of the degree of wear of the cathode, and a broken line indicates a result predicted based on data acquired in determination of the degree of wear of the cathode. Note that if the bias voltage and control electrode voltage are changed in a matrix, it takes time to acquire data. Therefore, in determination of the degree of wear of the cathode, data are acquired only under the optimum combination conditions $(V_{b1}, (V_{c1}), \ldots (V_{b5}, V_{c5})$.

When a decrease in emission current measured in determination of the degree of wear of the cathode 311 is less than 5% with respect to the emission current obtained last time in adjustment of the electron gun, "fine adjustment" of the electron gun 301 is performed. Fine adjustment of the electron gun 301 indicates adjustment performed by changing only the bias voltage without changing the control electrode voltage when obtaining a desired emission current. For example, as shown in FIG. 9, the desired emission current $I_1$ is obtained under the optimum combination condition $(V_{b1}, V_{c1})$ at the time of adjustment of the electron gun but emission current decrease to $I_1'$ due to progress of wear of the cathode 311.

At the time of fine adjustment, the optimum combination condition is changed from $(V_{b1}, V_{c1})$ to $(V_{b1}', V_{c1})$ to compensate for a decrease in emission current. Similarly, under each of the optimum combination conditions $(V_{b2}, V_{c2})$, $(V_{b3}, V_{c3})$, . . . , $(V_{b5}, V_{c5})$, only the bias voltage is changed to $(V_{b2}', V_{c2})$, $(V_{b3}', V_{c3})$, . . . , $(V_{b5}', V_{c5})$, thereby obtaining a desired emission current.

When the cathode 311 wears, the optimum condition (a condition under which current density and brightness reaches its peak (becomes highest)) of the electron gun 301 changes in a direction in which the bias voltage decreases, as shown in (b) of FIG. 9. This direction is the same as that in which the bias voltage is changed at the time of fine adjustment of the electron gun 301. That is, fine adjustment of the electron gun makes not only compensation for the emission current, but also electron gun settings close to the optimum condition although the settings are not made to completely match the optimum condition.

On the other hand, if the emission current measured in determination of the degree of wear of the cathode has decreased by 5% or more with respect to the emission current obtained last time in adjustment of the electron gun, "readjustment" of the electron gun 301 is performed. Readjustment of the electron gun 301 indicates adjustment performed by acquiring again an optimum combination condition of the bias voltage and control electrode voltage, and obtaining a desired emission current. If a decrease in emission current becomes large, only changing the bias voltage can compensate for the emission current but cannot compensate for a decrease in current density.

This means that the brightness of the electron gun 301 deteriorates (decreases) under each condition. The beam diameter cannot be focused to a small spot, thereby degrading the processing accuracy of the three-dimensional shaping apparatus 300. To solve this problem, if the emission current has decreased by 5% or more in determination of the degree of wear of the cathode, readjustment of the electron gun 301 is performed. Adjustment of a thermionic-emission electron gun having a four-electrode arrangement is cumbersome. However, it is possible to always operate the electron gun with appropriate settings by providing the above-described automatic adjustment mechanism.

Note that a "5%" decrease in emission current is set as a criterion to determine whether fine adjustment or readjustment is performed. The criterion is not limited to this. It is important to determine when the optimum condition of the electron gun from which the condition gradually becomes farther by only performing fine adjustment is readjusted. This is a factor to decide a criterion. As described above, if the "5%" decrease in emission current is set as a criterion, readjustment of the electron gun 301 is performed while the brightness does not deviate from the optimum condition so much.

For an apparatus required to provide high processing accuracy, it is desirable to set the criterion to 5% to frequently perform readjustment. On the other hand, an apparatus which is not required to provide high processing accuracy can be operated without any problem even if the brightness has no proper value. In this case, a "10%" or "20%" decrease in emission current may be set as a criterion so as to perform fine adjustment in most cases.

According to this embodiment, when the emission current is changed, it is possible to prevent a decrease in brightness of the electron beam. In addition, this embodiment makes possible to decide an optimum condition of a combination of the bias voltage and control voltage at which the brightness of the electron beam is maintained at the highest brightness (peak brightness) so as to prevent a decrease in brightness of the electron beam.

Note that the electron gun has been explained by using the three-dimensional shaping apparatus. The application of the electron gun according to this embodiment is not limited to this. For example, the electron gun can be used for an electron microscope and the like.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention is applicable to a system including a number of devices or a single apparatus. The present invention is also applicable even when an information processing program for implementing the functions of the embodiments is supplied to the system or apparatus directly or from a remote site. Hence, the present invention also incorporates the program installed in a computer to implement the functions of the present invention on the computer, a medium storing the program, and a WWW (World Wide Web) server that causes a user to download the program. The present invention specifically incorporates at least a non-transitory computer readable medium storing a program for causing the computer to execute the processing steps included in the above-described embodiments.

The invention claimed is:

1. An electron gun comprising:
a cathode that emits thermoelectrons;
a Wehnelt electrode that focuses the thermoelectrons;
a control electrode that extracts the thermoelectrons from a distal end of said cathode;
an anode that accelerates the thermoelectrons, and irradiates a powder with the thermoelectrons as an electron beam; and
an optimum condition collection controller that determines a degree of wear of said cathode based on an emission current of said electron gun, and executes a fine adjustment for decreasing a bias voltage of the Wehnelt electrode with maintaining a voltage of the control electrode or executes a readjustment comprising automatically setting a combination of the bias voltage and the control electrode voltage so that a brightness of the electron beam reaches a predetermined brightness, by readjustment of the bias voltage and the voltage of the control electrode, based on the determined degree of wear of said cathode.

2. The electron gun according to claim 1, wherein when said electron gun is in an idling state, said optimum condition collection controller determines a degree of wear of said cathode.

3. The electron gun according to claim 1, wherein when a decrease in the emission current is not smaller than a predetermined threshold, said optimum condition collection controller executes the readjustment, and when the decrease in the emission current is smaller than the predetermined threshold, said optimum condition collection controller executes the fine adjustment.

4. The electron gun according to claim 1, wherein said optimum condition collection controller changes the bias voltage to execute the fine adjustment in order to obtain a desired emission current.

5. The electron gun according to claim 1, wherein said optimum condition collection controller changes the bias voltage and the control electrode voltage to execute the readjustment in order to obtain a desired emission current.

6. A control method of an electron gun, comprising:
determining a degree of wear of a cathode based on a decrease in an emission current and beam diameter of the electron gun;
executing, when the decrease in the emission current is not smaller than a predetermined threshold, a readjustment comprising automatically setting a combination of a bias voltage of a Wehnelt electrode and a voltage of a control electrode such that, at the combination, a brightness of the electron beam reaches a predetermined brightness, by readjustment of the bias voltage and the voltage of the control electrode voltage, wherein the Wenhelt electrode focuses thermoelectrons emitted by a cathode and the control electrode extracts the thermoelectrons from a distal end of the cathode; and
executing, when the decrease in the emission current is smaller than the predetermined threshold, a fine adjustment for changing the bias voltage with maintaining a voltage of the control electrode.

7. A non-transitory computer readable medium storing a control program of an electron gun for causing a computer to execute a method, comprising:
determining a degree of wear of a cathode based on a decrease in an emission current of the electron gun;
executing, when the decrease in the emission current is not smaller than a predetermined threshold, a readjustment comprising automatically setting a combination of a bias voltage of a Wehnelt electrode and a voltage of a control electrode such that, at the combination, a brightness of the electron beam reaches a predetermined brightness, by readjustment of the bias voltage and the voltage of the a control electrode, wherein the Wenhelt electrode focuses thermoelectrons emitted by a cathode and the control electrode extracts the thermoelectrons from a distal end of the cathode; and
executing, when the decrease in the emission current is smaller than the predetermined threshold, the fine adjustment for changing the bias voltage with maintaining a voltage of the control electrode.

8. A three-dimensional shaping apparatus comprising the electron gun according to claim 1.

9. The electron gun according to claim 1, wherein said optimum condition collection controller executes the fine adjustment for decreasing a bias voltage of the Wehnelt electrode based on the decrease in the emission current or automatically sets the combination of the bias voltage and the control electrode voltage, by readjustment of the bias voltage and the voltage of the control electrode based on the decrease in the emission current and a beam diameter of an electron beam.

10. The electron gun according to claim 1, wherein said optimum condition controller automatically sets a combination of the bias voltage and the control electrode voltage at which a brightness of the electron beam reaches a peak, by readjustment of the bias voltage and the voltage of the control electrode, based on the determined degree of wear of said cathode.

* * * * *